(12) United States Patent
Lee

(10) Patent No.: US 8,253,183 B2
(45) Date of Patent: Aug. 28, 2012

(54) CHARGE TRAPPING NONVOLATILE MEMORY DEVICES WITH A HIGH-K BLOCKING INSULATION LAYER

(75) Inventor: Chang-hyun Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 236 days.

(21) Appl. No.: 12/861,366

(22) Filed: Aug. 23, 2010

(65) Prior Publication Data

US 2010/0314679 A1    Dec. 16, 2010

Related U.S. Application Data

(63) Continuation-in-part of application No. 12/031,096, filed on Feb. 14, 2008, now Pat. No. 7,804,120, which is a continuation of application No. 11/823,397, filed on Jun. 27, 2007, now abandoned, which is a continuation of application No. 10/795,537, filed on Mar. 8, 2004, now Pat. No. 7,253,467, which is a continuation-in-part of application No. 10/184,328, filed on Jun. 27, 2002, now Pat. No. 6,858,906.

(30) Foreign Application Priority Data

| Jun. 28, 2001 | (KR) | .................................. | 2001-37421 |
| Jan. 31, 2002 | (KR) | .................................. | 2002-05622 |
| Apr. 28, 2003 | (KR) | .................................. | 2003-26776 |

(51) Int. Cl.
*H01L 29/788* (2006.01)
(52) U.S. Cl. .................................. 257/315; 257/E29.166
(58) Field of Classification Search ........... 257/E29.166, 257/321, 324, 406, 407, 314–316
See application file for complete search history.

(56) References Cited

U.S. PATENT DOCUMENTS

| 4,542,400 A | 9/1985 | Hiraki et al. |
| 4,630,086 A | 12/1986 | Sato et al. |
| 4,870,470 A | 9/1989 | Bass, Jr. et al. |
| 5,215,842 A | 6/1993 | Aratani et al. |

(Continued)

FOREIGN PATENT DOCUMENTS

DE    30 32 364 A1    4/1982

(Continued)

OTHER PUBLICATIONS

English language translation, Office Action, German Patent Application No. 102 28 768.6-33, Sep. 15, 2009.

(Continued)

*Primary Examiner* — Nathan Ha
(74) *Attorney, Agent, or Firm* — Myers Bigel Sibley & Sajovec, P.A.

(57) ABSTRACT

Provided is a charge trapping nonvolatile memory device. The charge trapping nonvolatile memory device includes: an active pattern and a gate electrode, spaced apart from each other; a charge storage layer between the active pattern and the gate electrode; a tunnel insulation layer between the active pattern and the charge storage layer; and a blocking insulation layer disposed between the charge storage layer and the gate electrode and including a high-k layer with a higher dielectric constant than the tunnel insulation layer and a barrier insulation layer with a higher band gap than the high-k layer. A physical thickness of the high-k layer is less than or identical to that of the barrier insulation layer.

29 Claims, 14 Drawing Sheets

U.S. PATENT DOCUMENTS

| | | | |
|---|---|---|---|
| 5,270,298 | A | 12/1993 | Ramesh |
| 5,424,567 | A | 6/1995 | Chen |
| 5,536,667 | A | 7/1996 | Cho |
| 5,583,067 | A | 12/1996 | Sanchez |
| 5,619,051 | A | 4/1997 | Endo |
| 5,768,192 | A | 6/1998 | Eitan |
| 5,923,056 | A | 7/1999 | Lee et al. |
| 6,011,725 | A | 1/2000 | Eitan |
| 6,141,256 | A | 10/2000 | Forbes |
| 6,163,049 | A | 12/2000 | Bui |
| 6,166,958 | A | 12/2000 | Naruke et al. |
| 6,204,125 | B1 | 3/2001 | Lee et al. |
| 6,225,646 | B1 | 5/2001 | Gardner et al. |
| 6,236,076 | B1 | 5/2001 | Arita et al. |
| 6,287,915 | B1 | 9/2001 | Muramatsu |
| 6,294,436 | B1 | 9/2001 | Park et al. |
| 6,297,517 | B1 | 10/2001 | Matsumoto et al. |
| 6,307,775 | B1 | 10/2001 | Forbes et al. |
| 6,417,537 | B1 | 7/2002 | Yang et al. |
| 6,458,677 | B1 | 10/2002 | Hopper et al. |
| 6,465,828 | B2 | 10/2002 | Agarwal |
| 6,489,649 | B2 | 12/2002 | Kobayashi et al. |
| 6,512,274 | B1 | 1/2003 | King et al. |
| 6,614,069 | B2 | 9/2003 | Rösner et al. |
| 6,627,494 | B2 | 9/2003 | Joo et al. |
| 6,674,138 | B1 | 1/2004 | Halliyal et al. |
| 6,706,599 | B1 | 3/2004 | Sadd et al. |
| 6,730,960 | B2 | 5/2004 | Forbes |
| 6,768,165 | B1 | 7/2004 | Eitan |
| 6,791,883 | B2 | 9/2004 | Swift et al. |
| 6,803,272 | B1 | 10/2004 | Halliyal et al. |
| 6,818,558 | B1 | 11/2004 | Rathor et al. |
| 6,844,604 | B2 | 1/2005 | Lee et al. |
| 6,858,899 | B2 | 2/2005 | Mahajani et al. |
| 6,885,058 | B2 | 4/2005 | Wils et al. |
| 6,906,366 | B2 | 6/2005 | Hsu et al. |
| 6,906,390 | B2 | 6/2005 | Nomoto et al. |
| 6,924,186 | B2 | 8/2005 | Sandhu et al. |
| 6,949,788 | B2 | 9/2005 | Fujiwara et al. |
| 6,950,340 | B2 * | 9/2005 | Bhattacharyya ......... 365/185.18 |
| 6,963,103 | B2 | 11/2005 | Forbes |
| 7,087,954 | B2 | 8/2006 | Forbes |
| 7,109,548 | B2 | 9/2006 | Forbes et al. |
| 7,116,577 | B2 | 10/2006 | Eitan |
| 7,259,433 | B2 | 8/2007 | Nomoto et al. |
| 7,429,767 | B2 * | 9/2008 | Bhattacharyya ............... 257/324 |
| 7,629,641 | B2 * | 12/2009 | Bhattacharyya ............... 257/324 |
| 2002/0020871 | A1 | 2/2002 | Forbes |
| 2003/0047755 | A1 | 3/2003 | Lee et al. |
| 2003/0122204 | A1 | 7/2003 | Nomoto et al. |
| 2003/0155605 | A1 | 8/2003 | Jong et al. |
| 2003/0183873 | A1 | 10/2003 | Fujiwara |
| 2003/0205742 | A1 | 11/2003 | Hsu et al. |
| 2004/0021170 | A1 | 2/2004 | Caywood |
| 2005/0023603 | A1 | 2/2005 | Eldridge et al. |
| 2005/0189600 | A1 | 9/2005 | Ohuchi et al. |
| 2005/0199944 | A1 | 9/2005 | Chen et al. |
| 2005/0230766 | A1 | 10/2005 | Nomoto et al. |
| 2005/0247970 | A1 | 11/2005 | Jeon et al. |
| 2006/0008966 | A1 | 1/2006 | Forbes et al. |
| 2006/0022252 | A1 | 2/2006 | Doh et al. |
| 2006/0263981 | A1 | 11/2006 | Forbes |
| 2006/0284246 | A1 | 12/2006 | Forbes et al. |

FOREIGN PATENT DOCUMENTS

| | | |
|---|---|---|
| DE | 30 32 364 C3 | 4/1982 |
| JP | 62-033753 A | 2/1987 |
| JP | 63-000141 A | 1/1988 |
| JP | 02-266570 A | 10/1990 |
| JP | 05-129625 A | 5/1993 |
| JP | 05-251669 A | 9/1993 |
| JP | 07-326681 A | 12/1995 |
| JP | 08-017945 A | 1/1996 |
| JP | 08-078551 A | 3/1996 |
| JP | 8-162549 A | 6/1996 |
| JP | 11-008325 A | 1/1999 |
| JP | 11-186528 A | 7/1999 |
| JP | 11-297867 A | 10/1999 |
| JP | 2000-349285 A | 12/2000 |
| JP | 2001-35945 A | 2/2001 |
| JP | 2001077319 A | 3/2001 |
| JP | 2002-203917 A | 7/2002 |
| JP | 2002-231834 A | 8/2002 |
| JP | 2003-332467 A | 11/2003 |
| KR | 2001-0066386 A | 7/2001 |
| KR | 1020030057851 A | 7/2003 |
| KR | 10-2004-0106074 A | 12/2004 |
| KR | 1020040108309 A | 12/2004 |
| KR | 10-2005-0102864 A | 10/2005 |
| KR | 10-2006-0011478 A | 2/2006 |
| WO | WO 00/75997 A1 | 12/2000 |
| WO | WO 02/35610 A1 | 5/2002 |

OTHER PUBLICATIONS

Wong et al., "Preparation of Thin Dielectric Film for Nonvolatile Memory by Thermal Oxidation of Si-Rich LPCVD Nitride" *Journal of the Electrochemical Society* 148(5):G272-G278 (2001).

* cited by examiner

CHARGE TRAPPING NONVOLATILE MEMORY DEVICES WITH A HIGH-K BLOCKING INSULATION LAYER

CROSS-REFERENCE TO RELATED APPLICATIONS

This application is a continuation-in-part of U.S. patent application Ser. No. 12/031,096, filed Feb. 14, 2008 now U.S. Pat. No. 7,804,120, the content of which is herein incorporated by reference in its entirety, and which is a continuation of U.S. application Ser. No. 11/823,397, filed on Jun. 27, 2007 now abandoned, which is a continuation of U.S. application Ser. No. 10/795,537, filed Mar. 8, 2004 now U.S. Pat. No. 7,253,467, which is a continuation-in-part of U.S. patent application Ser. No. 10/184,328, filed Jun. 27, 2002 now U.S. Pat. No. 6,858,906, and which is related to and claims priority from Korean Patent application No. 2003-26776, filed on Apr. 28, 2003, from Korean Patent Application No. 2002-05622, filed on Jan. 31, 2002, and from Korean Patent Application No. 2001-37421, filed on Jun. 28, 2001, the contents of each of which are herein incorporated by reference in their entirety.

BACKGROUND

The present disclosure herein relates to semiconductor devices, and more particularly, to charge trapping nonvolatile memory devices.

A nonvolatile memory device based on charge trapping mechanism typically includes a charge storage layer between a control gate and a channel and is largely classified into a floating gate type and a charge trapping type according to how charge is stored therein. A floating gate type nonvolatile memory device generally uses an electrically-isolated conductive pattern (i.e., a floating gate) for charge storage and a charge trapping nonvolatile memory device general uses an insulation layer (e.g., a silicon nitride layer) having a high trap site density for charge storage. Until now, the floating gate type nonvolatile memory generally has better reliability than the charge trapping nonvolatile memory device. As a result, most nonvolatile memory devices are floating gate type devices due to their reliability and other possible technical advantages.

As line pattern widths are reduced in order to increase memory capacity, various difficulties can arise with, for example, providing a sufficient coupling ratio. Consequently, it is expected that future nonvolatile memory may increasingly use charge trapping type devices or 3-D charge trapping type devices. For example, according to the 2009 edition of the International Technology Roadmap for Semiconductors (ITRS), it has been noted that materials that may be used for a gate interlayer insulation layer or an interpoly dielectric have not yet been identified that can provide a sufficient coupling ratio to meet projected trends with line pattern widths, etc. Accordingly, ITRS 2009 expects that the floating gate devices and charge trapping devices will coexist from 2012 to 2013 and that 3-D charge trapping type flash memories will be shipped to the markets in 2014. However, in order for 3-D charge trapping type flash memory to reach a mass production state, techniques that satisfy technical requirements related to data retention characteristics and operating speeds are required.

SUMMARY

The present disclosure provides charge trapping nonvolatile memory devices that may enable increased operating speed.

The present disclosure also provides charge trapping nonvolatile memory devices that may provide improved data retention characteristics.

Embodiments of the inventive concept provide charge trapping nonvolatile memory devices that include an active pattern and a gate electrode that are spaced apart from each other. A charge storage layer is between the active pattern and the gate electrode. A tunnel insulation layer is between the active pattern and the charge storage layer. A blocking insulation layer is disposed between the charge storage layer and the gate electrode and includes a high-k layer having a greater dielectric constant than the tunnel insulation layer and a barrier insulation layer with a greater band gap than the high-k layer. A physical thickness of the high-k layer is not more than the barrier insulation layer.

In some embodiments, the high-k layer may be adjacent to the charge storage layer and the barrier insulation layer may be disposed between the high-k layer and the gate electrode.

In other embodiments, the high-k layer may be adjacent to the gate electrode and the barrier insulation layer may be disposed between the high-k layer and the charge storage layer. The charge trapping nonvolatile memory devices may further include an additional barrier insulation layer disposed between the high-k layer and the gate electrode, where the additional insulation layer has a greater band gap than the high-k layer. The additional barrier insulation layer may have substantially the same material as the barrier insulation layer and/or may have substantially the same thickness as the barrier insulation layer.

In still other embodiments, the high-k layer may include or consist of an $Al_2O_3$ layer, a $Ta_2O_5$ layer, a $TiO_2$ layer, a $PZT[Pb(Zi,Ti)O_3]$ layer, a $PbTiO_3$ layer, a $PbZrO_3$ layer, a La-doped $PZT[(Pb,La)(Zr,Ti)O_3]$ layer, a $PbO$ layer, a $SrTiO_3$ layer, a $BaTiO_3$ layer, a $BST[(Ba,Sr)TiO_3]$ layer, a $SBT(SrBi_2Ta_2O_9)$ layer, a $Bi_4Ti_3O_{12}$ layer, or a combination thereof.

In still other embodiments, the high-k layer may include a material having a greater band gap than the charge storage layer.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1:
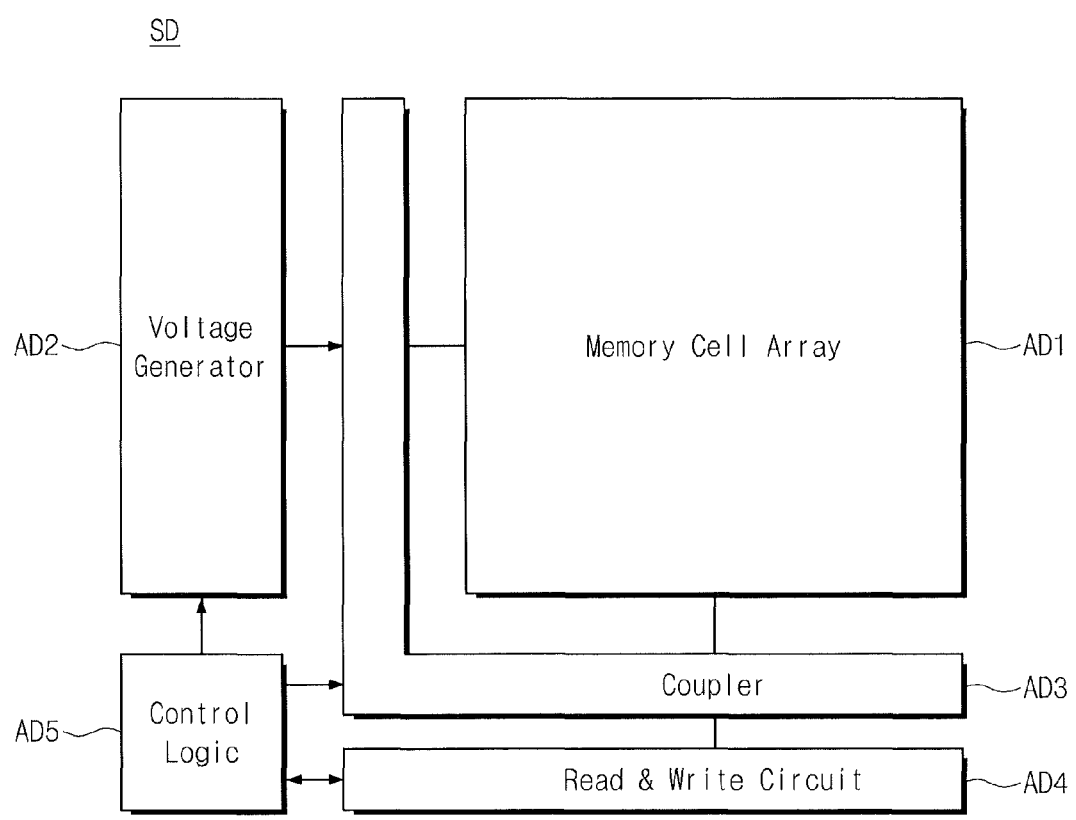
FIG. 1 is a block diagram of a semiconductor device according to some embodiments of the inventive concept.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a semiconductor device according to some embodiments of the inventive concept.

Referring to FIG. 1, the semiconductor device may include a memory cell array AD1, a voltage generator, AD2, a coupler AD3, a read and write circuit AD4, and a control logic ADS.

Figure 2:
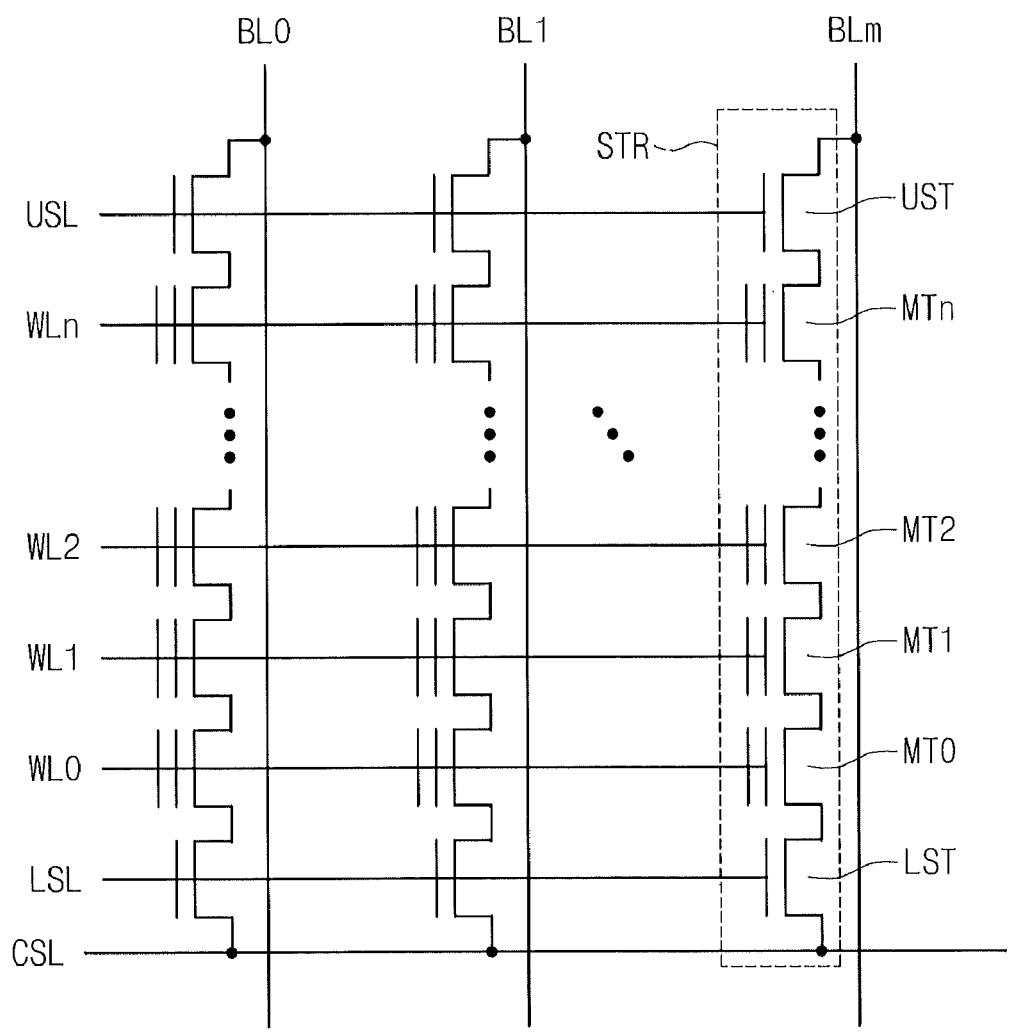
FIG. 2 is a circuit diagram illustrating a cell array AD1 of a semiconductor device according to an embodiment of the inventive concept.
Figure 5:
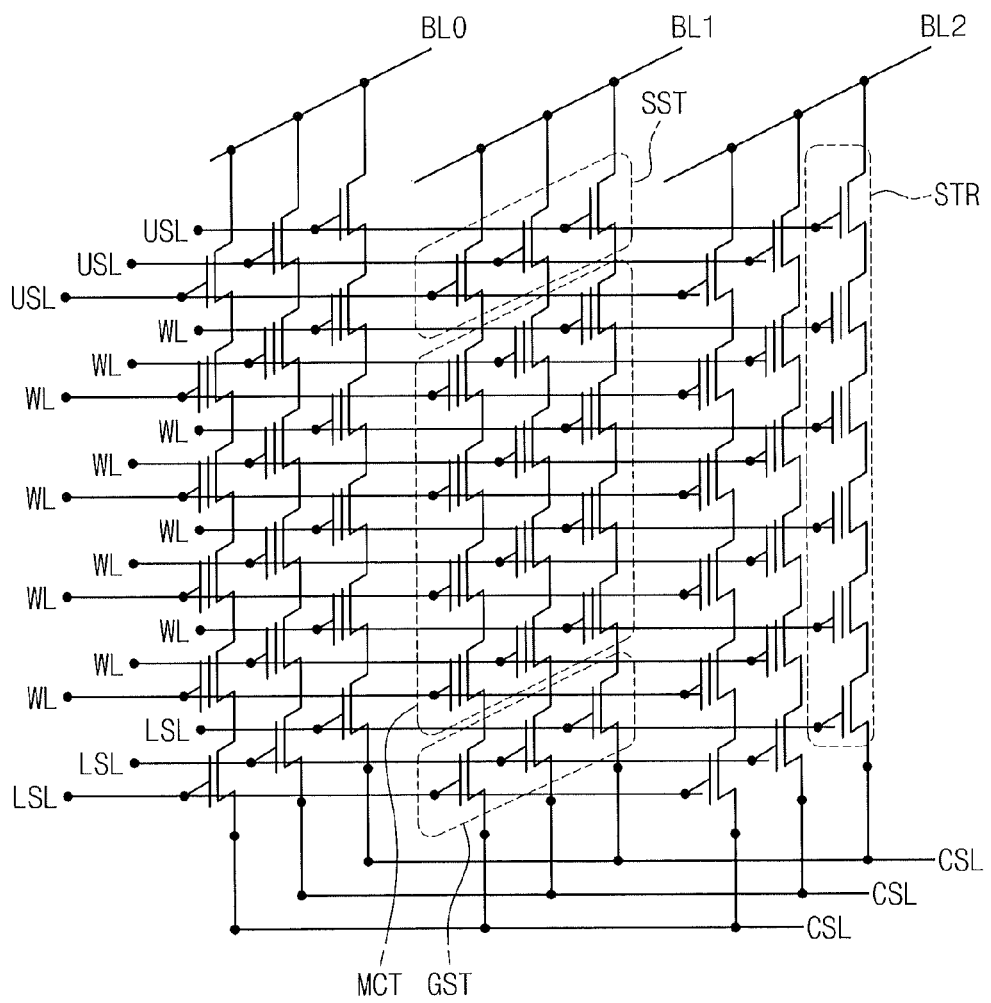
FIG. 5 is a circuit diagram illustrating a part of a cell array AD1 of a semiconductor device according to another embodiment of the inventive concept.

The memory cell array AD1 may include a plurality of cells, which are 2-dimensionally or 3-dimensionally arranged, and an interconnection structure for providing an electrical connection path to access the cells. According to an embodiment, the cells may be memory cells for storing data. For example, the cells may be a charge trapping type memory element included in a flash memory device and, in which case, the interconnection structure may include conductive lines (e.g., a plurality of word lines and a plurality of bit lines). In addition, the cells and interconnection structure of the memory cell array AD1 may be arranged to form a NAND type 2-D array structure as shown in FIG. 2 or a NAND type 3-D array structure as shown in FIG. 5. Alternatively, the cells and interconnection structure of the memory cell array AD1 may be arranged to form other array structures, such as, for example, a NOR or AND type structure.

The voltage generator AD2 may be controlled by the control logic ADS and may be configured to generate various electrical signals required for operations of the cells. For example, if the semiconductor device SD is a NAND flash memory device, the voltage generator AD2 may generate various voltages.

The coupler AD3 may be configured to connect the voltage generator AD2 to the interconnection structure. In more detail, the coupler AD3 may be configured to select at least one of interconnections constituting the interconnection structure, based on address information transmitted from the control logic ADS. In this aspect, the coupler AD3 may serve as a decoding circuit. Furthermore, the coupler AD3 may be configured to selectively apply signals generated from the voltage generator AD2 to the interconnection structure or partially-selected interconnections. In this aspect, the coupler AD3 may serve as a driving circuit.

The read and write circuit AD4 may be configured to write data on a part of the memory cell array AD1 or read data from a part of the memory cell array AD1, and may be controlled by the control logic ADS. According to an embodiment, the read and write circuit AD4 may be disposed between the coupler AD3 and the memory cell array AD1.

Figure 3:
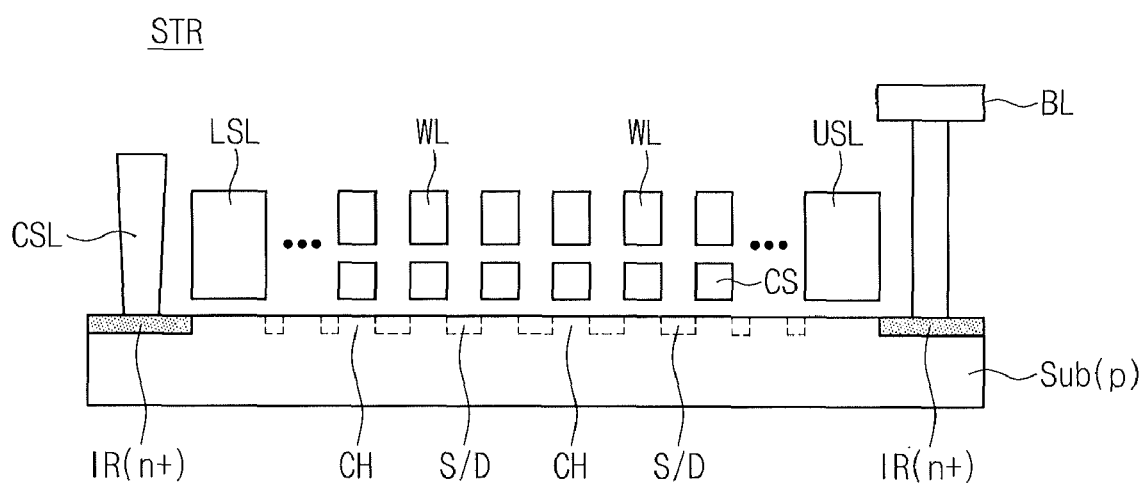
FIG. 3 is a sectional view illustrating a string STR of a semiconductor device according to an embodiment of the inventive concept.

FIG. 2 is a circuit diagram illustrating a cell array AD1 of a semiconductor device according to an embodiment of the inventive concept. FIG. 3 is a sectional view illustrating a string STR of a semiconductor device according to an embodiment of the inventive concept.

Referring to FIG. 2, the memory cell array AD1 may include a plurality of strings STR that are part of a NAND type cell array structure. Each string STR may include at least one upper selection transistor UST, at least one lower selection transistor LST, and a plurality of memory cell transistors MT0 to MTn connected in series therebetween UST and LST.

Each of the upper selection transistors UST is connected to one of bit lines BL0 to BLm and the lower selection transistors are commonly connected to the common source line CSL. Gate electrodes of the upper and lower selection transistors UST and LST are connected to an upper selection line USL and a lower selection line LSL crossing over the bit lines BL0 to BLm, respectively. Gate electrodes of the memory cell transistors MT0 to MTn between the upper and lower selection lines USL and LSL are connected to word lines WL0 to WLn crossing over the bit lines BL0 to BLm.

The upper and lower selection lines USL and LSL and the memory cell transistors MT0 to MTn, as shown in FIG. 3, may be a metal-oxide-semiconductor field-effect transistor (MOSFET) integrated into a semiconductor substrate Sub.

The memory cell transistors MT0 to MTn may include word lines WL used as a control gate electrode of the memory cell transistor and charge storages CS disposed between upper surfaces and used as a channel region of the memory cell transistor. Technical features related to the charge storage CS will be described in more detail with reference to FIGS. 6 through 14.

Referring to FIG. 3, each of the strings STR may have a different conductive type than the semiconductor substrate Sub and may include a pair of impurity regions IR formed at both ends of the corresponding string STR. For example, as shown in the drawings, if the semiconductor substrate Sub is a p-type, the impurity regions IR may have an n-type. One of the impurity regions IR may directly contact the common source line CSL and the other may electrically connected to one of the bit lines BL0 to BLm.

Figure 4A:
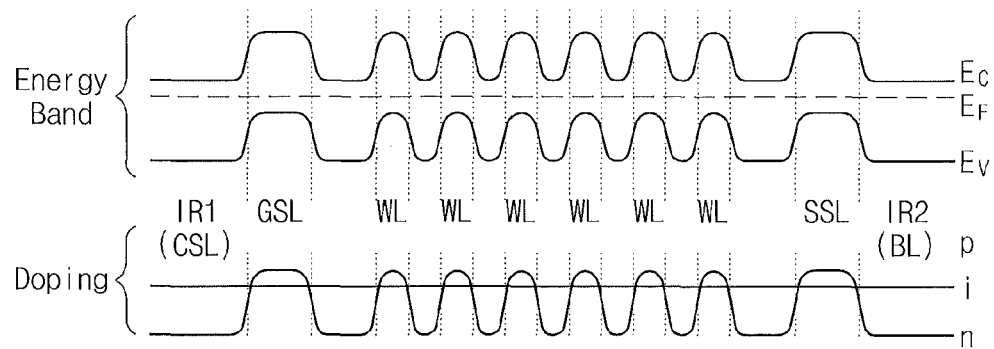
FIGS. 4A through 4F are diagrams illustrating doping profiles of a string STR according to embodiment of the inventive concept.

The semiconductor substrate Sub may include a plurality of source/drain regions S/D which are respectively spaced by the channel regions CH. The source/drain regions S/D may be disposed between the word lines WL, between the word line WL and the lower selection line LSL, or between the word line WL and the upper selection line USL. That is, the channel regions CH and the source/drain regions S/D may be sequentially and alternately arranged between the impurity regions IR. According to an embodiment, as shown in FIG. 4A, the source/drain regions S/D may have the same conductive type as the impurity regions IR and they may have substantially the same impurity concentration as the impurity regions IR.

Figure 4B:
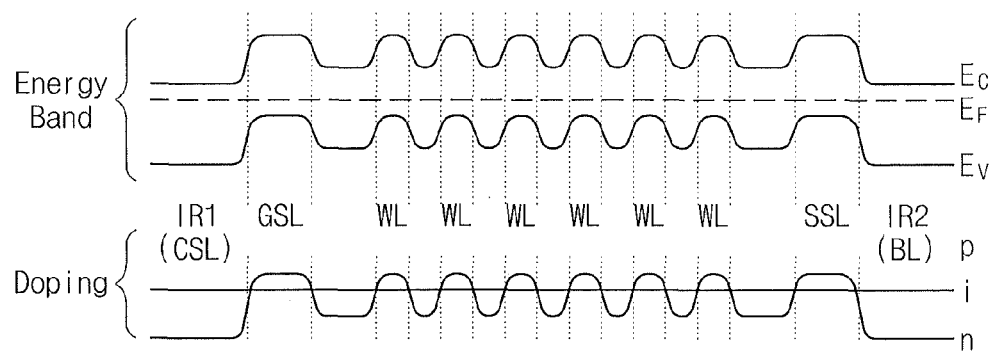
Figure 4C:
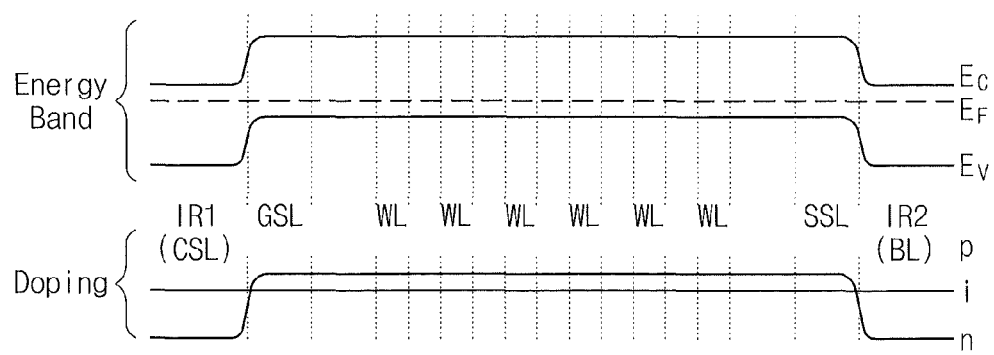
Figure 4D:
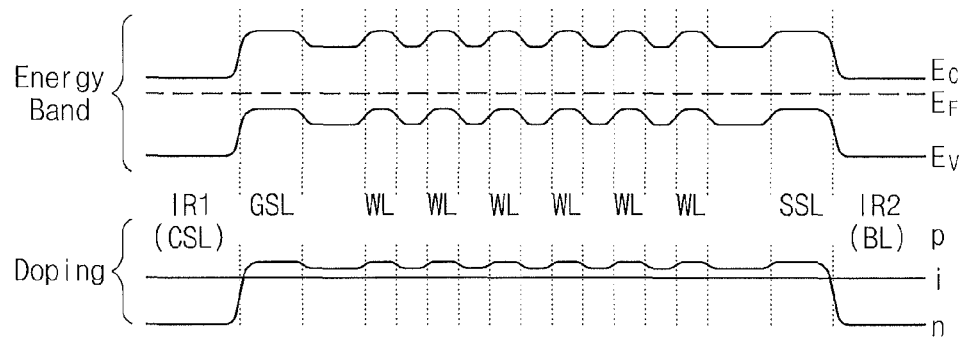
Figure 4E:
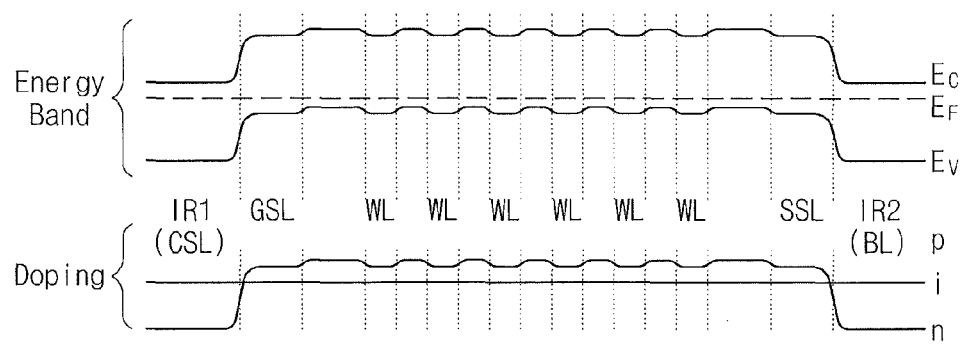

Moreover, according to another embodiment of the inventive concept, the source/drain regions S/D may have a different conductive type than the impurity regions IR and/or may have a different impurity concentration than the impurity regions IR. For example, as shown in FIG. 4B, the source/drain regions S/D may have the same conductive type as the impurity regions IR but may be doped with a lower impurity concentration than the impurity regions IR. Or, as shown in FIG. 4C, the source/drain regions S/D substantially may have the same impurity concentration and conductive type as the channel region CH. Furthermore, as shown in FIG. 4D, the source/drain regions S/D may have the same conductive type as the channel region CH but may be doped with a lower impurity concentration than the channel region CH. Or, as shown in FIG. 4E, the source/drain regions S/D may have the same conductive type as the channel region CH but may be doped with a higher impurity concentration than the channel region CH.

Figure 4F:
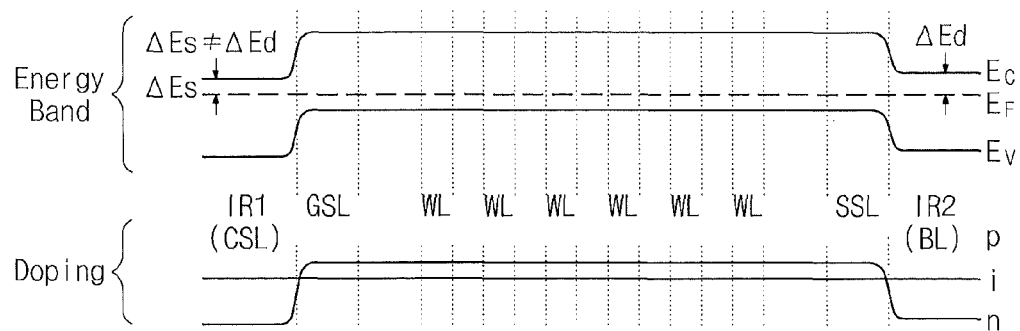

According to a modified embodiment, as shown in FIG. 4F, the pair of impurity regions IR configured as one string STR may be formed with respectively different impurity concentrations. For example, the memory cell array AD1 may include 3-dimensionally arranged cells (which will be described with reference to FIG. 5), and two impurity regions IR forming one string may not be simultaneously formed and may be configured with the doping profile shown in FIG. 4F.

Additionally, although doping profiles of strings to which technical features of various embodiments of the inventive concept may be applied are exemplarily described with reference to FIGS. 4A through 4F, the inventive concept is not limited thereto and thus may be applied to semiconductor devices having various other doping profiles.

FIG. 5 is a circuit diagram illustrating a part of a cell array AD1 of a semiconductor device according to another embodiment of the inventive concept.

Referring to FIG. 5, the memory cell array AD1 of the semiconductor device may include a common source line CSL, a plurality of bit lines BL0 to BL3, and a plurality of strings STR disposed between the common source line CSL and the bit lines BL0 to BL3.

The common source line CLS may be a conductive thin layer disposed on a substrate or an impurity region formed in the substrate. The bit lines BL0 to BL3 may have conductive patterns (e.g., metal lines) spaced apart from the substrate and disposed thereon. The bit lines BL0 to BL3 are 2-dimensionally arranged and a plurality of strings STR are connected in parallel to the bit lines BL0 to BL3, respectively. Accordingly, the strings STR are 2-dimensionally arranged on the substrate.

Each of the strings STR may include a ground selection transistor GST connected to the common source line CSL, a string selection transistor SST connected to the bit lines BL0 to BL3, and a plurality of memory cell transistors MCT disposed between the ground and string selection transistors GST and SST. The ground selection transistor GST, the string selection transistor SST, and the memory cell transistors MCT may be connected in series. Furthermore, the ground selection lines GSL, the word lines WL, and the string selection lines SSL, which are disposed between the common source line CSL and the bit lines BL0 to BL3, may be used as gate electrodes of the ground selection transistors GST, the memory cell transistors MCT, and the string selection transistors SST, respectively.

According to this embodiment, each of the strings STR may include a semiconductor pattern SP vertical to the substrate SUB, which will be described with reference to FIGS. 7 and 8, and the semiconductor pattern SP may have the doping profiles described with reference to FIG. 4C or FIG. 4F.

Figure 6:
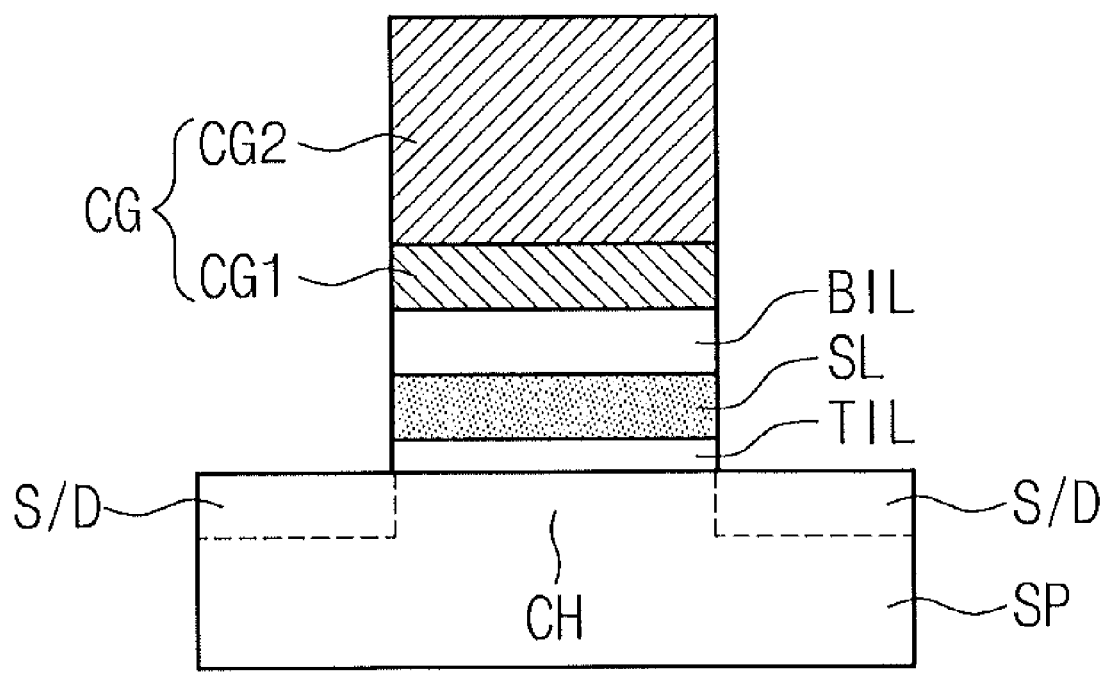
FIG. 6 is a sectional view illustrating a memory cell transistor according to some embodiments of the inventive concept.

FIG. 6 is a sectional view illustrating a memory cell transistor according to some embodiments of the inventive concept. In more detail, FIG. 6 exemplarily illustrates a memory cell transistor that is described with reference to FIGS. 2 and 3.

Referring to FIG. 6, the memory cell transistor may include a semiconductor pattern SP and a control gate CG spaced apart from the semiconductor pattern SP. A storage layer SL may be formed between the semiconductor pattern SP and the control gate CG, a tunnel insulation layer TIL may be formed between the storage layer SL and the control gate CG, and a blocking insulation layer BIL may be formed between the storage layer SL and the control get CG. The control gate CG may be used as the word line WL shown in FIGS. 2 and 3, and the storage layer CL may be used as the charge storage CS shown in FIG. 3.

According to one aspect of the inventive concept, the surface of the control gate CG that is directly contacting the blocking insulation layer BIL may be formed from a material having an electron work function of at least about 4 eV. According to some embodiments, the control gate CG may include or consist of titanium, titanium nitride, tantalum, tantalum nitride, tungsten, tungsten nitride, hafnium, niobium, molybdenum, molybdenum nitride, ruthenium monoxide, ruthenium dioxide, iridium, platinum, cobalt, chrome, titanium aluminide, titanium aluminum nitride, palladium, tungsten silicicide, nickel silicide, or chemical compounds thereof.

According to some other embodiments, the control gate CG may be formed from a metallic material having an electron work function of at least about 4 eV and a melting point of at least 600 degrees Celsius. Accordingly, deterioration of the control gate CG, e.g., aluminum hillock, caused by subsequent thermal treatment steps can be reduced/prevented. According to some other embodiments, the gate electrode disclosed in U.S. patent application Ser. Nos. 10/795,537 and 10/184,328 may include or consist of a metallic material having an electron work function of at least about 4 eV and a melting point of at least 600 degrees Celsius, which have similar characteristics to a material of the control gate CG.

Moreover, according to some embodiments, the control gate CG may include a plurality of conductive layers. For example, the control gate CG may include a first control gate CG1 and a second control gate CG2. In this case, the first control gate CG1 is formed of a material that has a lower resistivity than a partial region (hereinafter, referred to as a channel region CH) of the semiconductor pattern SP disposed blow the first control gate CG1 and the second control gate CG2 may be formed of a material that has a lower resistivity than the first control gate CG1. For example, the first control gate CG1 may include or consist of a material having an electron work function of at least about 4 eV and the second control gate CG2 may include or consist of tungsten, aluminum, and/or copper.

The semiconductor pattern SP may have source/drain regions S/D at both sides of the channel region CH. Here, the channel region CH and the source/drain regions S/D may be formed with the doping profiles described in one of the embodiments of FIGS. 4A through 4F. However, the doping profiles of the channel region CH and the source/drain regions S/D are not limited to the embodiments of FIGS. 4A through 4F. For example, although a conductive type of the channel region CH is a p-type exemplarily in FIGS. 4A through 4F, it may be an n-type and in this case, the doping profile shown in FIGS. 4A through 4F may be reversed. That is, the channel region CH and the source/drain regions S/D may have the reversed doping profile.

The tunnel insulation layer TIL, the storage layer SL, and the blocking insulation layer BIL may be formed using respectively different forming processes, and accordingly, they may have at least distinctive three layers. The tunnel insulation layer TIL, the storage layer SL, and the blocking insulation layer BIL may be substantially formed of materials having electrical insulation characteristics. For example, all of the tunnel insulation layer TIL and the blocking insulation layer BIL may include insulation layers and the storage layer SL may include or consist of $Si_3N_4$, $SiO_2$, silicon rich $SiO_2$, and/or ferroelectric. Alternatively, the tunnel insulation layer TIL and the blocking insulation layer BIL may include insulation layers and the storage layer SL may include at least one thin insulation layer surrounding nano-dots. The nano-dots may include a metallic material, silicon material, silicon germanium material, and/or an insulation material having a smaller band gap than the thin insulation layer. Accordingly, each of the metallic material, the silicon material, the silicon germanium material, and the insulation material can have a smaller band gap than the thin insulation layer. Although the nano-dots can be formed from a metallic material, a silicon material and/or or a silicon germanium material, because each of the nano-dots is substantially isolated from each other by being surrounded by the thin insulation layer, the storage layer CL may thereby substantially have electrical insulation characteristics.

Furthermore, as disclosed in U.S. Pat. No. 6,858,906, the entire content of which is incorporated herein by reference, the blocking insulation layer BIL may have a greater dielectric constant than the tunnel insulation layer TIL. Technical features related to permittivities of the blocking insulation layer BIL and the tunnel insulation layer TIL and their band gaps will be described in more detail with reference to FIGS. 9 through 14.

Figure 7:
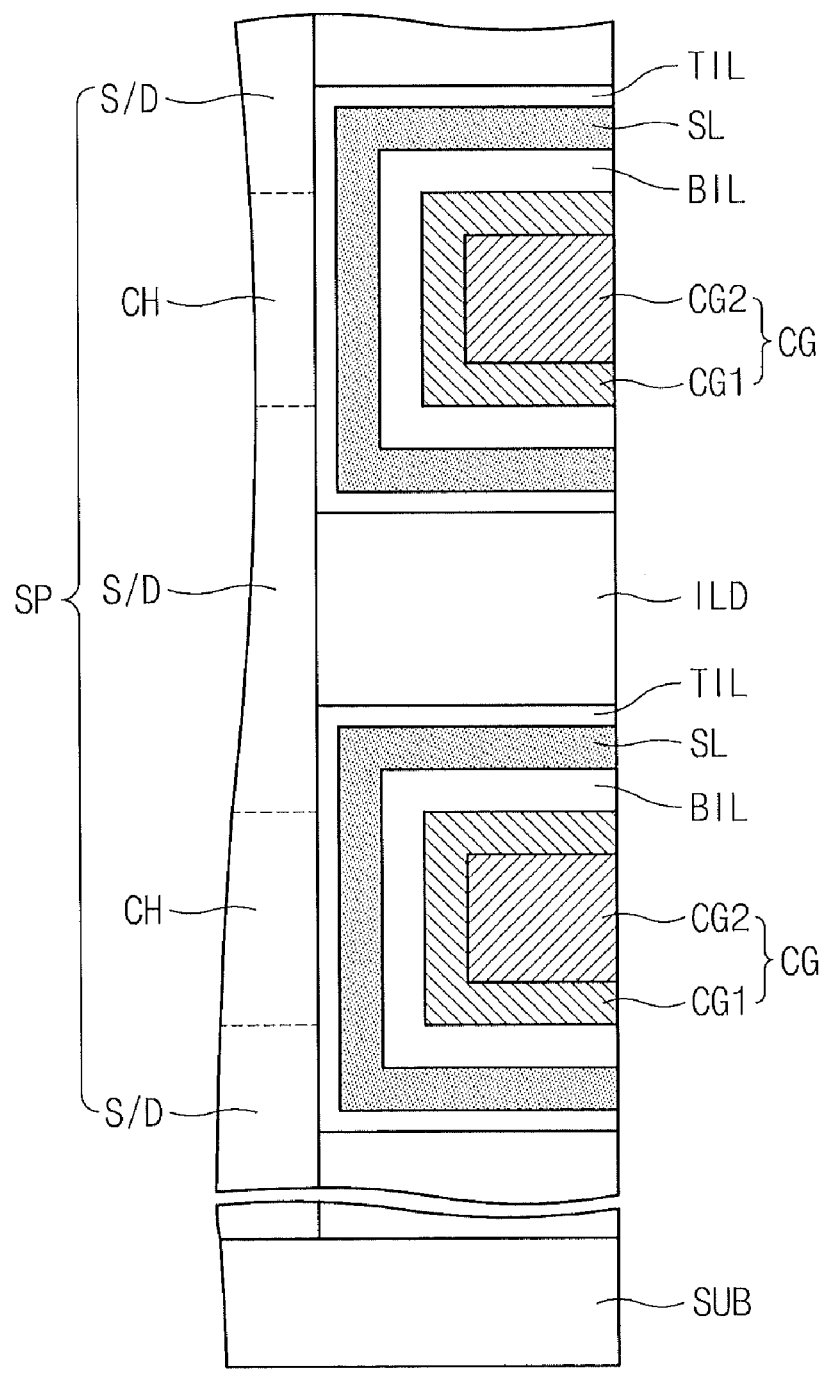
FIGS. 7 and 8 are sectional views illustrating memory cell transistors according to other embodiments of the inventive concept.
Figure 8:
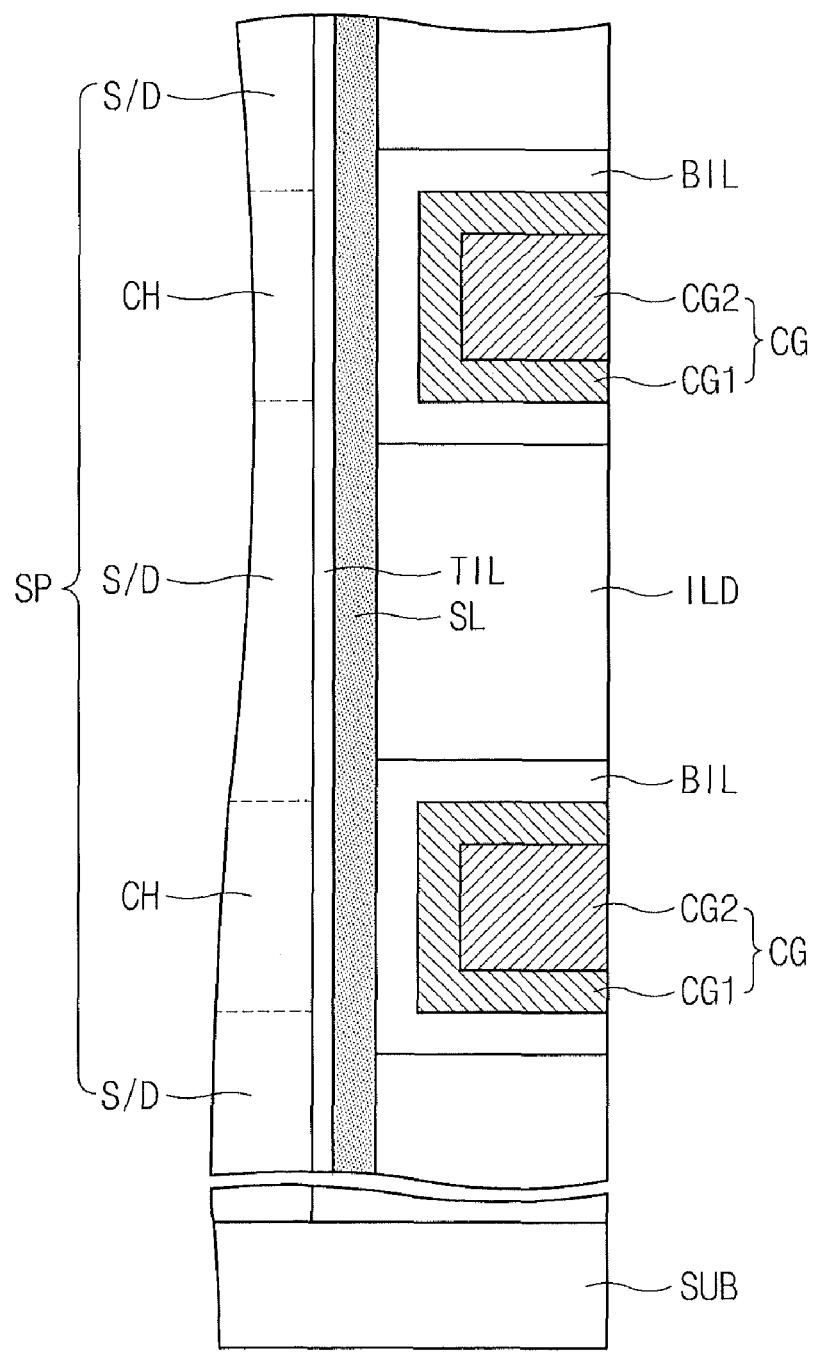

FIGS. 7 and 8 are sectional views illustrating memory cell transistors according to other embodiments of the inventive concept. Specifically, FIGS. 7 and 8 are sectional views illustrating a part of the memory cell transistors MCT constituting one string described with reference to FIG. 5. For concise description, overlapping technical features with respect to the memory cell transistors described with reference to FIG. 6 will be omitted.

Referring to FIGS. 7 and 8, a semiconductor pattern SP is disposed on a substrate SUB, and control gates CG used as the word lines WL of FIG. 5 are sequentially stacked on at least one sidewall of the semiconductor pattern SP. A blocking insulation layer BIL, a storage layer SL, and a tunnel insulation layer TIL may be disposed between the control gate CG and the sidewalls of the semiconductor pattern SP. The blocking insulation layer BIL may be disposed adjacent to the control gate CG and the tunnel insulation layer TIL may be disposed adjacent to the semiconductor pattern SP.

According to some embodiments of the inventive concept, at least one of the blocking insulation layer BIL, the storage layer SL, and the tunnel insulation layer TIL may extend from the control gate CG and the sidewalls of the semiconductor pattern SP. The extended layer(s) may be classified into a vertical extension and a horizontal extension. In case of the vertical extension, a corresponding layer is conformally formed along the control gate CG and in case of the horizontal extension, a corresponding layer extends along the control gate CG and thus may cover the sidewall, bottom, and top of the control gate CG. For example, as shown in FIG. 7, the blocking insulation layer BIL, the storage layer SL, and the tunnel insulation layer TIL may extend horizontally and thus sequentially cover the sidewall, bottom, and top of the control gate CG. Alternatively, as shown in FIG. 8, the blocking insulation layer BIL extends horizontally and the storage layer SL and the tunnel insulation layer TIL extend vertically to cover the sidewall of the semiconductor pattern SP. Although not illustrated, each of the blocking insulation layer BIL, the storage layer SL, and the tunnel insulation layer TIL may extend vertically.

FIGS. 9 through 14 are energy band diagrams illustrating a unit cell of a charge trapping nonvolatile memory device according to some embodiments of the inventive concept.

Referring to FIGS. 9 through 14, as described with reference to FIGS. 6 through 8, a tunnel insulation layer TIL, a storage layer SL, and a blocking insulation layer BIL may be disposed between a semiconductor pattern SP and a control gate CG.

Figure 13:
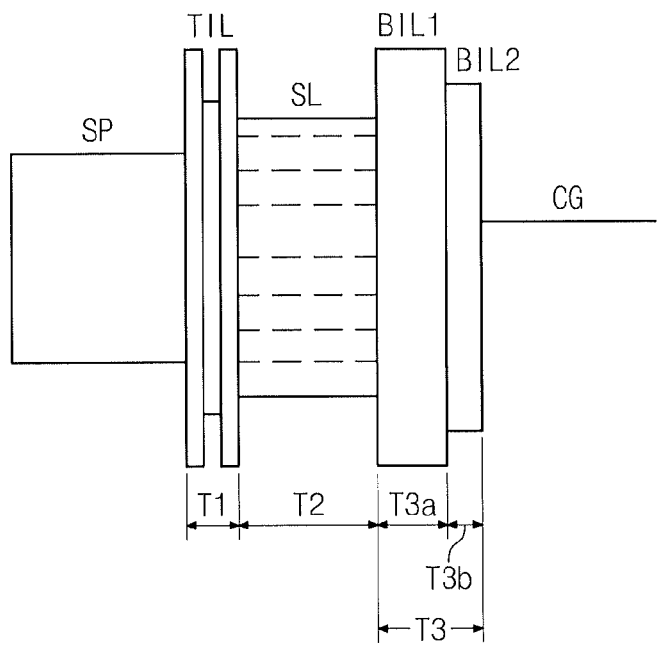
Figure 14:
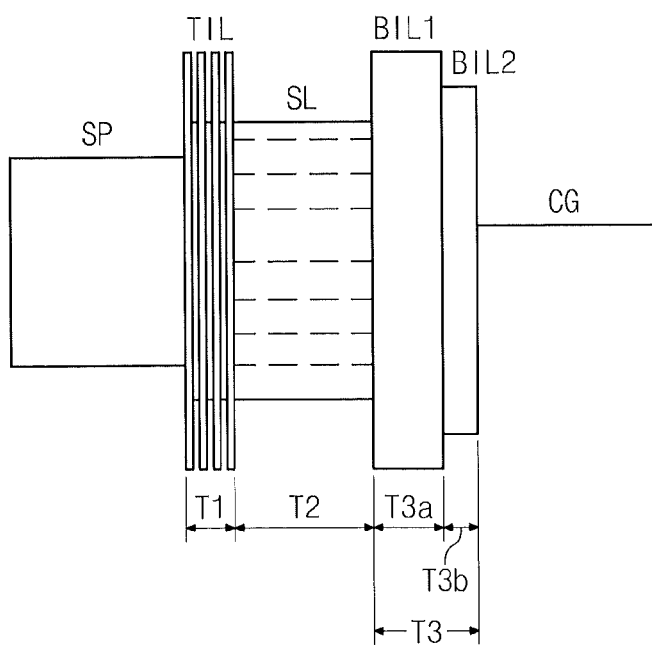

According to some embodiments of the inventive concept, the tunnel insulation layer TIL may be a single layer as shown in FIGS. 9 through 12. For example, the tunnel insulation layer TIL may be a single layer formed of a silicon oxide. According to other embodiments, as shown in FIGS. 13 and 14, the tunnel insulation layer TIL may be a multi layered structure including a plurality of layers with at least two of the layers having different band gaps with respect to each other. For example, the tunnel insulation layer TIL may include at least two of silicon oxide, silicon nitride, or silicon oxide nitride.

According to some embodiments of the inventive concept, a resistivity of the storage layer SL may be greater than a resistivity of the semiconductor pattern SP. Furthermore, the storage layer SL may include or consist of a material having a smaller band gap than the tunnel insulation layer TIL and the blocking insulation layer BIL. For example, as mentioned above, the storage layer SL may include or consist of $Si_3N_4$, SiO$_2$, silicon rich SiO$_2$, and/or a ferroelectric layer, and/or it may include at least one thin insulation layer surrounding nano-dots.

According to some embodiments of the inventive concept, as shown in FIGS. 9, 10, 13, and 14, the blocking insulation layer BIL may have a double layer structure including a first blocking insulation layer BIL1 adjacent to the storage layer SL and a second blocking insulation layer BIL2 adjacent to the control gate CG. According to one aspect of the inventive concept, one of the first and second blocking insulation layers BIL1 and BIL2 may be a high-k layer having a higher dielectric constant than the tunnel insulation layer TIL and the other one of the first and second blocking insulation layers BIL1 and BIL2 may be a barrier insulation layer having a higher band gap than the high-k layer. A physical thickness of the high-k layer may be no greater than that of the barrier insulation layer. Furthermore, according to another aspect of the inventive concept, the high-k layer may include a material having a greater band gap than the storage layer SL.

Figure 9:
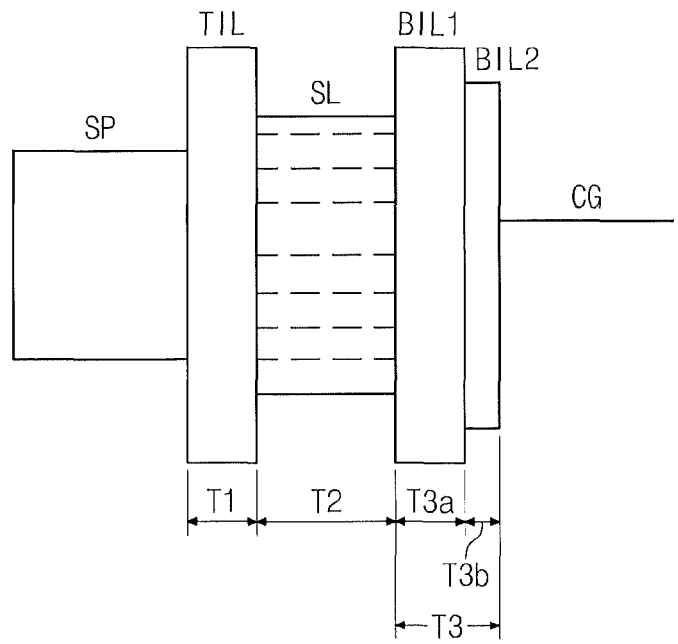
FIGS. 9 through 14 are energy band diagrams illustrating a unit cell of a charge trapping nonvolatile memory device according to some embodiments of the inventive concept.
Figure 10:
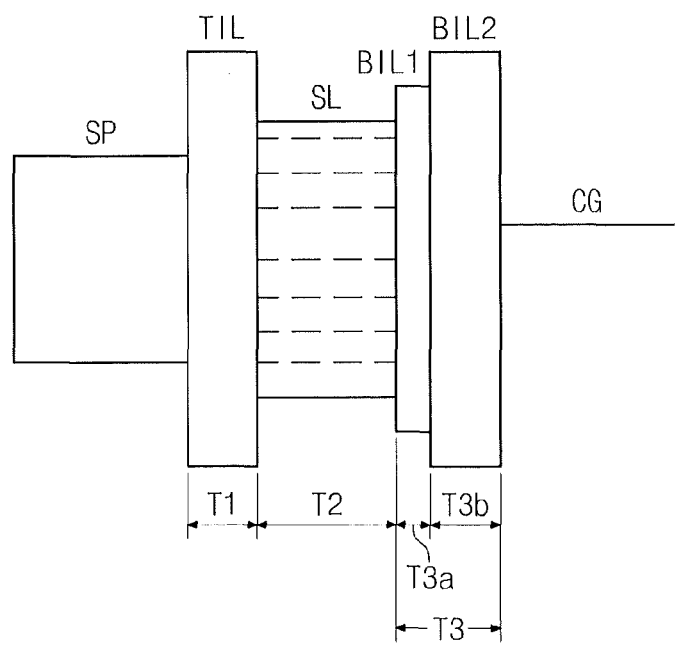

For example, as shown in FIGS. 9, 13, and 14, the first and second blocking insulation layers BIL1 and BIL2 may be the barrier insulation layer and the high-k layer, respectively, and the thickness T3$a$ of the first blocking insulation layer BIL1 or the barrier insulation layer may be greater than that T3$b$ of the second blocking insulation layer BIL2 or the high-k layer. Alternatively, as shown in FIG. 10, the first and second blocking insulation layers BIL1 and BIL2 may be the high-k layer and the barrier insulation layer, respectively, and the thickness T3$a$ of the first blocking insulation layer BIL1 or the high-k layer may be less than that T3$b$ of the second blocking insulation layer BIL2 or the barrier insulation layer.

The high-k layer may include a metal oxide of elements in Group III or Group VB of the Mendeleef periodic table. Alternatively, the high-k layer may include or consist of a chemical compound where Group IV elements are doped into a metal oxide of elements in Group III or Group VB in the Mendeleef periodic table. In this case, the Group IV element may include or consist of Zr, Si, Ti, and/or Hf. In more detail, the high-k layer may include or consist of Al$_2$O$_3$ layer, a Ta$_2$O$_5$ layer, a TiO$_2$ layer, a PZT[Pb(Zi,Ti)O$_3$] layer, a PbTiO$_3$ layer, a PbZrO$_3$ layer, a La-doped PZT[(Pb,La)(Zr,Ti)O$_3$] layer, a PbO layer, a SrTiO$_3$ layer, a BaTiO$_3$ layer, a BST[(Ba,Sr)TiO$_3$] layer, a SBT(SrBi$_2$Ta$_2$O$_9$) layer, a Bi$_4$Ti$_3$O$_{12}$ layer, or a combination thereof. Alternatively, the high-k layer may include or consist of HfO$_2$, Hf$_{1-x}$Al$_x$O$_y$, Hf$_x$Si$_{1-x}$O$_2$, or a combination thereof.

Figure 11:
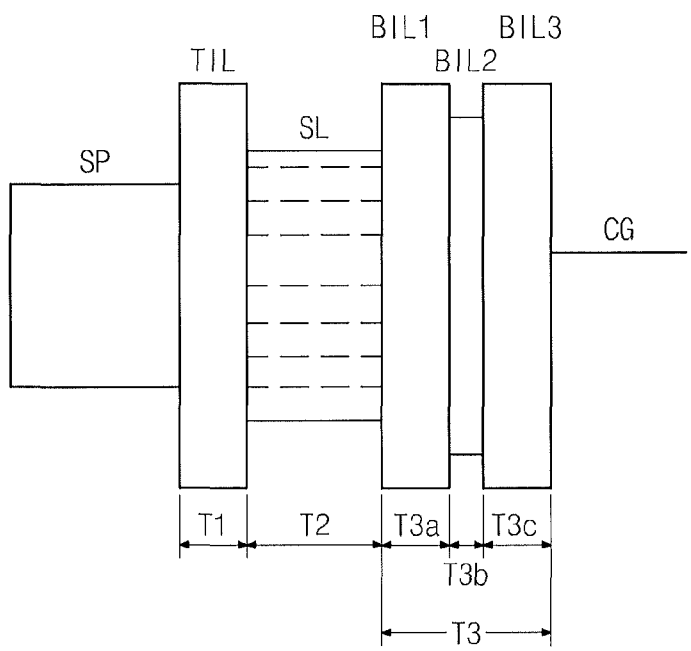
Figure 12:
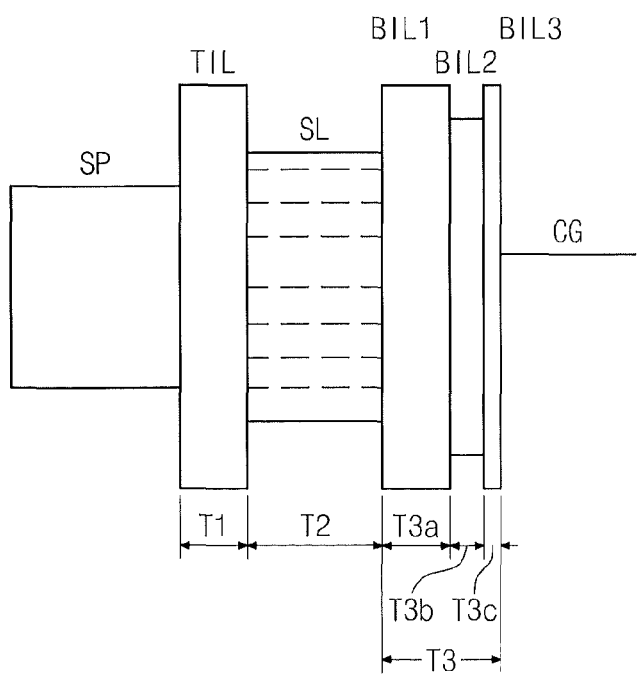

According to some other embodiments of the inventive concept, as shown in FIGS. 11 and 12, the blocking insulation layer BIL may further include a third blocking insulation layer BIL3 disposed between the second blocking insulation layer BIL2 and the control gate CG, in addition to the first and second blocking insulation layers BIL1 and BIL2. Herein, as described with reference to FIGS. 9, 13, and 14, the first and second blocking insulation layers BIL1 and BIL2 are the barrier insulation layer and the high-k layer, respectively. The thickness T3$a$ of the first blocking insulation layer BIL1 or the barrier insulation layer may be greater than that T3$b$ of the second blocking insulation layer BIL2 or the high-k layer. The third blocking insulation layer BIL3 is formed of a material having a greater band gap than the high-k layer, such that it may serve as an additional barrier insulation layer that suppresses leakage of charges stored in the storage layer SL.

The first and third blocking insulation layers BIL1 and BIL3 may comprise substantially the same material and/or may have substantially the same thickness. For example, as shown in FIG. 11, the first and third blocking insulation layers BIL1 and BIL3 may be substantially formed with the same thickness and band gap. Or, as shown in FIG. 12, the first and third blocking insulation layers BIL1 and BIL3 may be substantially formed with the same band gap but have respectively different thicknesses. According to modified embodiments, although not illustrated, the first and third blocking insulation layers BIL1 and BIL3 may have respectively different materials and thicknesses. According to an embodiment, the first and third blocking insulation layers BIL1 and BIL3 may each include a silicon oxide layer.

Figure 15:
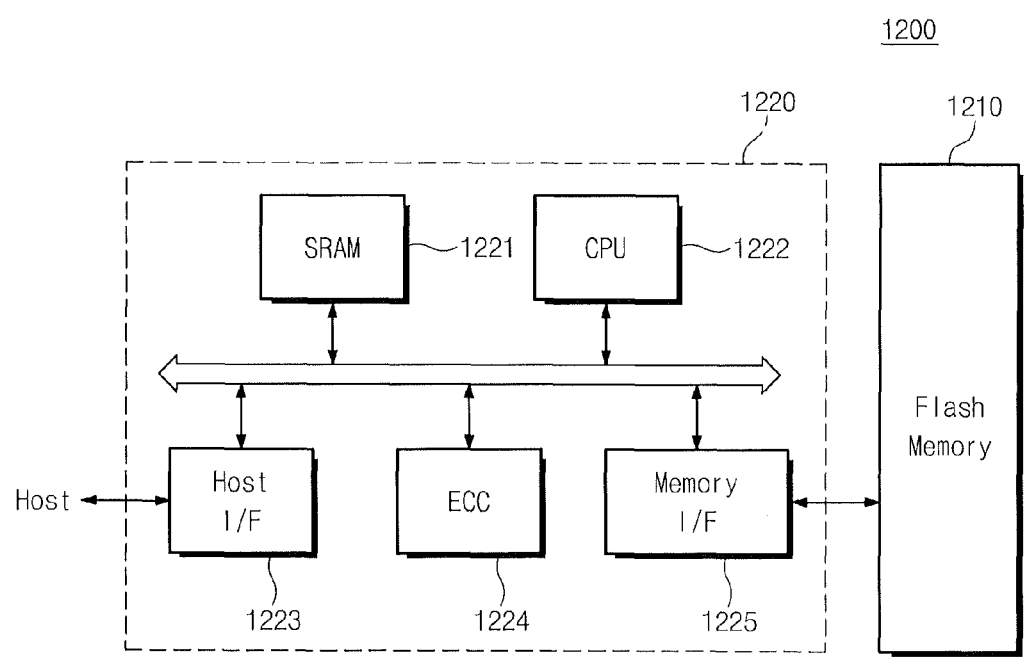
FIG. 15 is a block diagram illustrating one example of a memory card 1200 including a flash memory device according to the inventive concept.

FIG. 15 is a block diagram illustrating one example of a memory card 1200 including a flash memory device according to the inventive concept. Referring to FIG. 15, the memory card 1200 for supporting a high capacity data storing ability includes a flash memory device 1210. The memory card 1200 includes a memory controller 1220 for controlling general data exchange between a host and the flash memory device 1210.

A SRAM 1221 is used as an operating memory of a central processing unit (CPU) 1222. A host interface (I/F) 1223 includes a data exchange protocol of a host connected to the memory card 1200. An error correction code (ECC) 1224 detects and corrects errors included in data read from the multi-bit flash memory device 1210. A memory interface (I/F) 1225 interfaces with the flash memory device 1210 of the inventive concept. The CPU 1222 controls general control operations for data exchange of the memory controller 1220. Although not illustrated in the drawings, it is apparent to those skilled in the art that the memory card 1200 may further include a ROM (not shown) for storing code data to interface with a host.

According to the flash memory device and the memory card, or the memory system of the inventive concept, a highly reliable memory system can be provided through the flash memory device 1210 with improved erase characteristics of dummy cells. Especially, the flash memory device of the inventive concept may be provided for a memory system, as a solid state disk (SSD) which is being actively developed. In this case, a highly-reliable memory system can be realized by preventing read errors caused from dummy cells.

Figure 16:
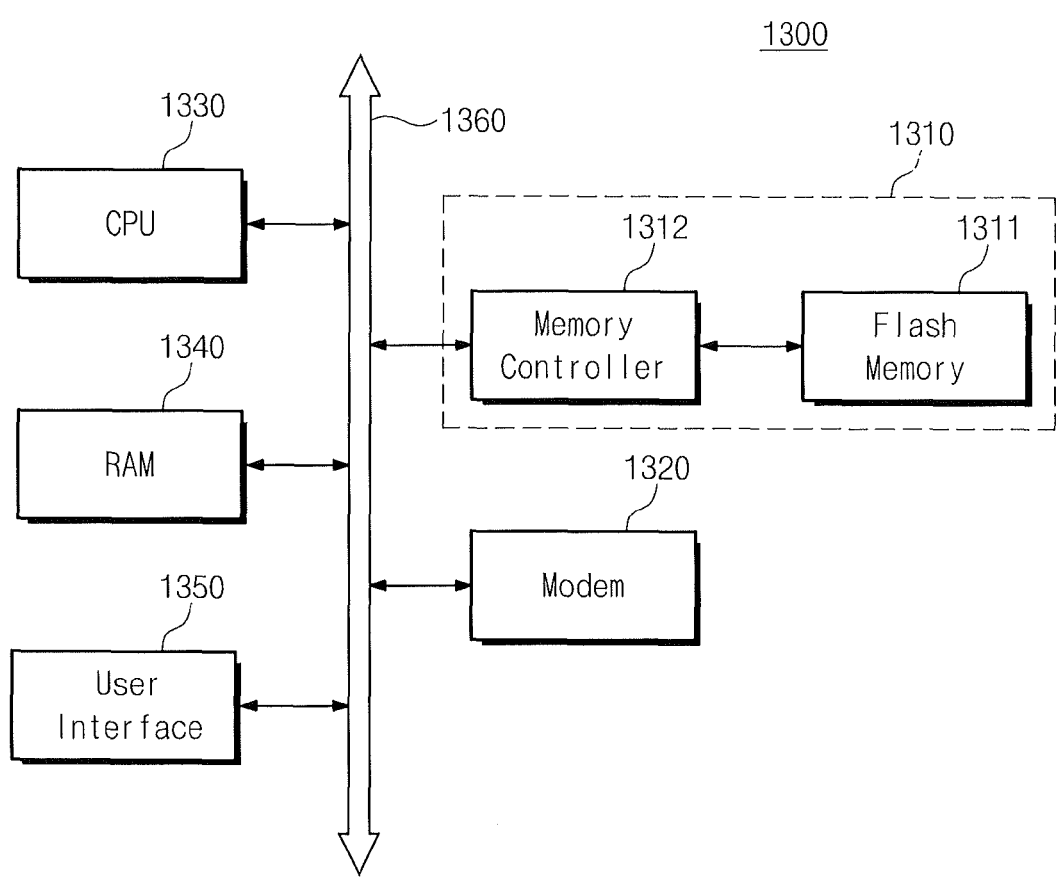
FIG. 16 is a block diagram illustrating an information processing system including a flash memory system according to the inventive concept.

FIG. 16 is a block diagram illustrating an information processing system 1300 including a flash memory system 1310 according to the inventive concept. Referring to FIG. 16, the flash memory system 1310 is equipped in an information processing system such as a mobile device or a desktop computer. The information processing system 1300 includes a flash memory system 1310 and a modem 1320, a central processing unit (CPU) 1330, a RAM 1340, and a user interface 1350, each of which is electrically connected to a system bus. The flash memory system 1310 may have substantially the same configuration as the above mentioned memory system or flash memory system. Data processed by the CPU 1330 or data inputted from the external are stored in the flash memory system 1310. Here, the flash memory system 1310 may include a SSD and in this case, the information processing system 1300 may more store a large amount of data in the flash memory system 1310 with increased stability and reliability. With increased reliability, the flash memory system 1310 may provide higher-speed data exchanges with the information processing system 1300 as resources become available from less error correction. Although not illustrated in the drawings, it will be apparent to those skilled in the art in view of the present disclosure that the information processing system 1300 may further include an application chip, a camera image sensor (CIS), and an input/output device.

Moreover, a flash memory device or a memory system according to some embodiments of the inventive concept may be mounted in packages of various forms. For example, a flash memory device or a memory system according to some embodiments of the inventive concept may be packaged and mounted in a Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and/or Wafer-level Processed Stack Package (WSP).

Charge trapping nonvolatile memory devices according to some embodiments of the inventive concept therefore may include a high-k layer and a blocking insulation layer that includes a thicker barrier insulation layer than the high-k layer such that operating speed and/or data retention characteristics can be improved.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A charge trapping nonvolatile memory device comprising:
    an active pattern and a gate electrode that are spaced apart from each other;
    a charge storage layer between the active pattern and the gate electrode;
    a tunnel insulation layer between the active pattern and the charge storage layer; and
    a blocking insulation layer disposed between the charge storage layer and the gate electrode and including a high-k layer with a higher dielectric constant than the tunnel insulation layer and a barrier insulation layer with a higher band gap than the high-k layer,
    wherein a physical thickness of the high-k layer is not more than that of the barrier insulation layer.

2. The charge trapping nonvolatile memory device of claim 1, wherein the high-k layer is adjacent to the charge storage layer and the barrier insulation layer is disposed between the high-k layer and the gate electrode.

3. The charge trapping nonvolatile memory device of claim 1, wherein the high-k layer is adjacent to the gate electrode and the barrier insulation layer is disposed between the high-k layer and the charge storage layer.

4. The charge trapping nonvolatile memory device of claim 3, further comprising an additional barrier insulation layer disposed between the high-k layer and the gate electrode, wherein the additional barrier insulation layer has a greater band gap than the high-k layer.

5. The charge trapping nonvolatile memory device of claim 4, wherein the additional barrier insulation layer has substantially the same thickness and/or is substantially the same material as the barrier insulation layer.

6. The charge trapping nonvolatile memory device of claim 4, wherein the additional barrier insulation layer is a silicon oxide layer.

7. The charge trapping nonvolatile memory device of claim 1, wherein the high-k layer comprises an $Al_2O_3$ layer, a $Ta_2O_5$ layer, a $TiO_2$ layer, a $PZT[Pb(Zi,Ti)O_3]$ layer, a $PbTiO_3$ layer, a $PbZrO_3$ layer, a La-doped $PZT[(Pb,La)(Zr,Ti)O_3]$ layer, a PbO layer, a $SrTiO_3$ layer, a $BaTiO_3$ layer, a $BST[(Ba,Sr)TiO_3]$ layer, a $SBT(SrBi_2Ta_2O_9)$ layer, a $Bi_4Ti_3O_{12}$ layer, or a combination thereof.

8. The charge trapping nonvolatile memory device of claim 1, wherein the high-k layer comprises a material having a greater band gap than the charge storage layer.

9. The charge trapping nonvolatile memory device of claim 1, wherein the high-k layer comprises a metal oxide of elements in Group III or Group VB of the Mendeleef periodic table.

10. The charge trapping nonvolatile memory device of claim 1, wherein the high-k layer comprises a metal oxide of elements in Group III or Group VB of the Mendeleef periodic table doped with a group IV element.

11. The charge trapping nonvolatile memory device of claim 10, wherein the Group IV element comprises Zr, Si, Ti, and/or Hf.

12. The charge trapping nonvolatile memory device of claim 1, wherein the high-k layer comprises $HfO_2$, $HfO_{1-x}Al_xO_y$, $Hf_xSi_{1-x}O_2$, or a combination thereof.

13. The charge trapping nonvolatile memory device of claim 1, wherein the barrier insulation layer comprises a silicon oxide layer.

14. The charge trapping nonvolatile memory device of claim 1, wherein the tunnel insulation layer comprises a silicon oxide layer.

15. The charge trapping nonvolatile memory device of claim 1, wherein:
    the tunnel insulation layer comprises sequentially-stacked insulation layers; and
    at least two layers of the sequentially-stacked insulation layers have different relative band gaps.

16. The charge trapping nonvolatile memory device of claim 1, wherein resistivity of the charge storage layer is greater than resistivity of the active pattern.

17. The charge trapping nonvolatile memory device of claim 1, wherein the charge storage layer comprises a $Si_3N_4$ layer, a $SiO_2$ layer, a silicon rich $SiO_2$ layer, a thin insulation layer surrounding nano-dots, and/or a ferroelectric layer.

18. The charge trapping nonvolatile memory device of claim 17, wherein the nano-dots comprise a metallic material, a silicon material, a silicon germanium material, and/or an insulation material having a smaller band gap than the thin insulation layer.

19. The charge trapping nonvolatile memory device of claim 1, wherein the gate electrode comprises a material having an electron work function of at least about 4 eV.

20. The charge trapping nonvolatile memory device of claim 1, wherein the gate electrode comprises a metallic material having an electron work function of at least about 4 eV and a melting point greater than 600 degrees Celsius.

21. The charge trapping nonvolatile memory device of claim 1, wherein the gate electrode comprises a first electrode adjacent to the blocking insulation layer and a second electrode that directly contacts the first electrode,
    wherein the first electrode comprises a metal nitride and the second electrode comprises a metal having a lower resistivity than the first electrode.

22. The charge trapping nonvolatile memory device of claim 1, wherein the active pattern comprises a channel region adjacent to the gate electrode and source/drain regions at both sides of the channel region,
    wherein the source/drain regions have a different conductive type and/or a different impurity concentration than the channel region.

23. The charge trapping nonvolatile memory device of claim 1, wherein the active pattern comprises a channel region adjacent to the gate electrode and source/drain regions at both sides of the channel region,
wherein the source/drain regions have substantially the same conductivity type and/or substantially the same impurity concentration as the channel region.

24. The charge trapping nonvolatile memory device of claim 1, further comprising a semiconductor substrate,
wherein a major axis of the active pattern is along a direction penetrating a top surface of the semiconductor substrate and a major axis of the gate electrode is along a direction parallel to the top surface of the semiconductor substrate.

25. The charge trapping nonvolatile memory device of claim 24, wherein the tunnel insulation layer, the charge storage layer, and the blocking insulation layer are disposed between a sidewall of the gate electrode and a sidewall of the active pattern, and the sidewalls are substantially vertical to the top surface of the semiconductor substrate.

26. The charge trapping nonvolatile memory device of claim 25, wherein the tunnel insulation layer, the charge storage layer, and the blocking insulation layer extend vertically from between the sidewalls of the gate electrode and the active pattern to cover sidewalls of the active pattern vertically spaced from the gate electrode.

27. The charge trapping nonvolatile memory device of claim 25, wherein the tunnel insulation layer, the charge storage layer, and the blocking insulation layer extend horizontally from between the sidewalls of the gate electrode and the active pattern to a top and a bottom of the gate electrode.

28. The charge trapping nonvolatile memory device of claim 24, wherein:
the tunnel insulation layer extends vertically from between a sidewall of the gate electrode and a sidewall of the active pattern to cover a sidewall of the active pattern spaced vertically apart from the gate electrode;
at least one of the high-k layer and the barrier insulation layer extend horizontally from between the sidewalls of the gate electrode and the active pattern to a top and a bottom of the gate electrode; and
the sidewalls are substantially vertical to the top surface of the semiconductor substrate.

29. The charge trapping nonvolatile memory device of claim 28, wherein:
one of the high-k layer and the barrier insulation layer extends vertically from between a sidewall of the gate electrode and a sidewall of the active pattern to around the active pattern spaced vertically apart from the gate electrode; and
the other one of the high-k layer and the barrier insulation layer extends horizontally from between the sidewalls of the gate electrode and the active pattern to a top and a bottom of the gate electrode.

* * * * *